(12) United States Patent
Van Dijk et al.

(10) Patent No.: US 6,914,468 B2
(45) Date of Patent: Jul. 5, 2005

(54) CONTROLLABLE DELAY CIRCUIT FOR DELAYING AN ELECTRICAL SIGNAL

(75) Inventors: Victor Emmanuel Stephanus Van Dijk, Eindhoven (NL); Rinze Ida Mechtildis Peter Meijer, Eindhoven (NL); Hendricus Joseph Maria Veendrick, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/479,552

(22) PCT Filed: Jun. 4, 2002

(86) PCT No.: PCT/IB02/02039

§ 371 (c)(1),
(2), (4) Date: Dec. 3, 2003

(87) PCT Pub. No.: WO02/099970

PCT Pub. Date: Dec. 12, 2002

(65) Prior Publication Data

US 2004/0150451 A1 Aug. 5, 2004

(30) Foreign Application Priority Data

Jun. 7, 2001 (EP) .............................................. 01202178

(51) Int. Cl.[7] .............................................. H03H 11/26
(52) U.S. Cl. ....................................... 327/269; 327/271
(58) Field of Search ................................ 327/269, 270, 327/271, 276, 277

(56) References Cited

U.S. PATENT DOCUMENTS 5,192,886 A    3/1993  Wetlaufer ................... 327/158
6,052,011 A  * 4/2000  Dasgupta ..................... 327/270
6,242,954 B1 * 6/2001  Taniguchi et al. .......... 327/149
6,323,711 B2 * 11/2001 Truong et al. .............. 327/259

* cited by examiner

Primary Examiner—Timothy P. Callahan
Assistant Examiner—An T. Luu
(74) Attorney, Agent, or Firm—Aaron Waxler

(57) ABSTRACT

The invention relates to a controllable delay circuit for delaying an electrical input signal wherein the controllable delay circuit is arranged for receiving an input signal and at least one control signal, wherein, in use, the delay circuit delays the input signal by a delay for generating an output signal, wherein the delay is a function of the at least one control signal, wherein the delay circuit comprises a first module for generating a base signal and at least one support signal on the basis of the input signal and the at least one control signal, wherein, in use, the phase and/or the amplitude of the at least one support signal is controllable with respect to the phase and/or the amplitude of the base-signal by means of the at least one control signal, wherein the delay circuit also comprises a second module connected to the first module, which second module comprises a signal-conductor and at least one support conductor, wherein the signal conductor and the at least one support conductor extend, at least over a part of the conductors, essentially parallel to one another in one another's vicinity, wherein, in use, the first module supplies the base signal to a first end of the signal conductor for generating an output-signal at a second end of the signal conductor, and wherein, in use, the first module supplies the at least one support signal to the at least one support conductor.

9 Claims, 5 Drawing Sheets

| S | | T |
|---|---|---|
| S1 | S2 | |
| 11 | 11 | A |
| 11 | 01 | B |
| 01 | 11 | C |
| 11 | 00 | D |
| 01 | 01 | E |
| 00 | 11 | F |
| 00 | 01 | G |
| 01 | 00 | H |
| 00 | 00 | I |

FIG. 2

CONTROLLABLE DELAY CIRCUIT FOR DELAYING AN ELECTRICAL SIGNAL

The invention relates to a controllable delay circuit for delaying an electric input signal, which delay circuit is designed for receiving the input signal and at least one control signal, wherein during operation the delay circuit delays the input signal by a delay for generating an output signal, which delay is a function of the at least one control signal.

The controllable delay circuit mentioned above is known in practice. An example of such a controllable delay circuit is given in U.S. Pat. No. 5,192,886. This patent document describes a controllable CMOS delay circuit (with reference to FIG. 1 of the document). The delay by which the input signal is delayed for generating the output signal is a function of two control signals here.

The known controllable delay circuit is used for the timing of electric signals, and in particular for synchronizing electric signals. This may be useful in cases in which timing problems are found to arise in a circuit already designed, while it is not desirable to change the design. The use of controllable delay units in the circuits renders it possible to change the timing of electric signals without an expensive new design having to be made.

A disadvantage of the known controllable delay unit is that the control range of controllable delays is limited in principle. This makes it necessary for practical applications to connect several controllable delay units in series for realizing a practically useful controllable delay unit. Each delay element here has its own intrinsic (minimum) delay, so that the intrinsic delay of the controllable delay unit is the sum of the intrinsic delays of the individual delay elements. This results in a considerable intrinsic delay of the delay unit. Said intrinsic delays may vary considerably as a function of several factors such as temperature and variations in supply voltage.

There is a demand for a controllable delay circuit with a comparatively wide control range in which the intrinsic delay of the controllable delay circuit is small. In particular, there is a demand for a large number of different discrete delays which in combination yield a wide control range. It is often desirable in the latter case for a comparatively large number of controllable delays to be available which are substantially uniformly distributed over said control range, so that a high resolution of discrete delays is obtained.

It is an object of the invention to satisfy the demand mentioned above. To achieve this, the controllable delay circuit according to the invention is characterized in that the delay circuit comprises a first module for generating a base signal and at least one support signal on the basis of the input signal and the at least one control signal, wherein during operation the phase and/or the amplitude of the at least one support signal is controllable with respect to the phase and/or the amplitude of the base signal by means of the at least one control signal, and wherein the delay circuit furthermore comprises a second module which is connected to the first module and which comprises a signal conductor and at least one support conductor, which signal conductor and which at least one support conductor extend mutually substantially parallel over at least a portion of the conductors in one another's vicinity, and wherein during operation the first module supplies the base signal to a first end of the signal conductor for generating the output signal at a second end of the signal conductor, and wherein during operation the first module supplies at least the at least one support signal to the at least one support conductor.

It is true in an embodiment of the delay circuit according to the invention that the base signal is formed by an input signal which was delayed independently of the control signal. It is possible in particular here that the base signal consists of the input signal.

Since the signal conductor and the at least one support conductor are situated adjacent to one another, there will be a lateral capacitive coupling between the signal conductor and the at least one support conductor. This coupling may decrease or increase virtually under the influence of the signals carried by these conductors. This effect may be compared to the Miller effect which is a known side effect in analog circuits. The Miller effect will change the delay across the signal conductor accordingly, which is also referred to as the cross-talk effect or cross-talk induced delay.

The cross-talk effect is generally regarded as an adverse parasitic effect by designers of electric circuits. According to the invention, however, this effect is utilized. The lateral capacitive coupling between the signal conductor and the at least one support conductor may be varied through the control of the phase difference between the signal in the signal conductor and the at least one support signal in the at least one support conductor and/or the control of the amplitude of the support signal in the at least one support conductor. A variation of the lateral capacitive coupling causes a variation in the delay over the signal conductor, so that the transport speed of the signal through the signal conductor is also varied. In a first situation, in which said phase difference between the base signal and the at least one support signal is 180°, the lateral capacitive coupling is a maximum. The base signal in this situation is subject to a maximum delay during its transport through the signal conductor. In a second situation, in which said phase difference between the base signal and the support signal is equal to zero, the capacitive coupling is a minimum. The support conductors then act as booster conductors. The base signal will be transported faster through the signal conductor in such a situation than in a comparable fictitional situation in which the auxiliary conductors are absent. The intrinsic (minimum) delay of the controllable delay circuit according to the invention is a minimum as a result of this.

Another example of a known delay circuit is one built up from inter alia a "Front End of Line" (FEoL) portion and a "Back End of Line" (BEoL) portion. The desired delay is realized here especially in the FEoL portion. The technological developments of the electrical components of the FEoL and the BEoL lead us to expect a trend according to which the delays in the BEoL will increase in future generations of delay circuits, whereas the delays in the FEoL will decrease. This trend would seem to cast doubt on the future usefulness of the known delay units. This is in contrast to the delay circuit according to the invention, which will indeed profit from said technological developments.

A wide control range of delays can be realized with the controllable delay circuit according to the invention in a simple manner. The extent of the control range is a function inter alia of the length of the signal conductor and of the support conductors. Thus a length of at least 10 mm for the conductors renders it possible to achieve a ratio between the greatest delay value and the smallest delay value equal to a factor 6. The delay value of the controllable delay circuit here is the sum of the fixed delay of the first module and the controllable delay of the second module.

A first additional advantage of the controllable delay circuit according to the invention is that the second module may be designed in a wide variety of shapes because it is mainly formed by conductors. These conductors may be simply laid out in straight lines and/or meandering structures. This offers a designer an additional degree of freedom in designing a controllable delay circuit.

A second additional advantage of the controllable delay circuit according to the invention is that a shielding may be achieved in a simple manner by means of said at least one support conductor. The electrical coupling to the surroundings is reduced thereby. This helps to counteract the generation of jitter owing to external interference sources.

A third additional advantage of the controllable delay circuit according to the invention is that it can be digitally implemented in a simple manner.

An embodiment of the controllable delay circuit according to the invention is characterized in that the second module comprises at least two support conductors, of which at least two support conductors are at different distances from the signal conductor, while during operation the first module generates at least two support signals. The different distances result in couplings which are different for each support conductor, so that a satisfactory distribution of the number of controllable delay values over said control range can be realized. A high resolution of delay values within the control range can thus be achieved in the case of a digital delay circuit.

It is true in an embodiment of the invention that the second module comprises at least two support conductors, of which at least two support conductors are at least substantially at the same distance from the at least one signal conductor. A wide control range can be achieved with this embodiment because the auxiliary conductors can now be placed at a comparatively short distance from the signal conductor. This leads to a comparatively strong capacitive coupling, so that the smallest delay value and the greatest delay value lie far apart.

It is true in a preferred embodiment that the delay unit comprises a receiver which is connected to the second end of said signal conductor for receiving the output signal. If so desired, the receiver may be used for amplifying the output signal if this output signal was attenuated during its transport through the signal conductor. The receiver may, for example, be an alternative circuit (flip-flop, logic circuit, etc.). The slope of the electric output signal may be improved by the receiver (for example, may be made steeper). This is of especial importance in the case of a high signal propagation rate.

A favorable embodiment of the controllable delay circuit according to the invention is characterized in that the second module is in addition provided with a substrate layer or a metal plate, which layer or plate extends substantially along the signal conductor. It is possible with said substrate layer or metal plate either to obtain a further control of the delay of the signal or to obtain a further shielding of the signal conductor. In the latter case, the substrate layer or metal plate may be coupled, for example, to a constant voltage or to ground. The influence of interference sources present outside the second module is further reduced by the further shielding.

The invention will now be explained in more detail with reference to the drawing, in which:

FIG. 1 diagrammatically shows a first embodiment of a controllable delay circuit according to the invention;

FIG. 2 is a table indicating the relationship between the control signal and a number of transport modes of the controllable delay circuit of FIG. 1;

Figure 1:
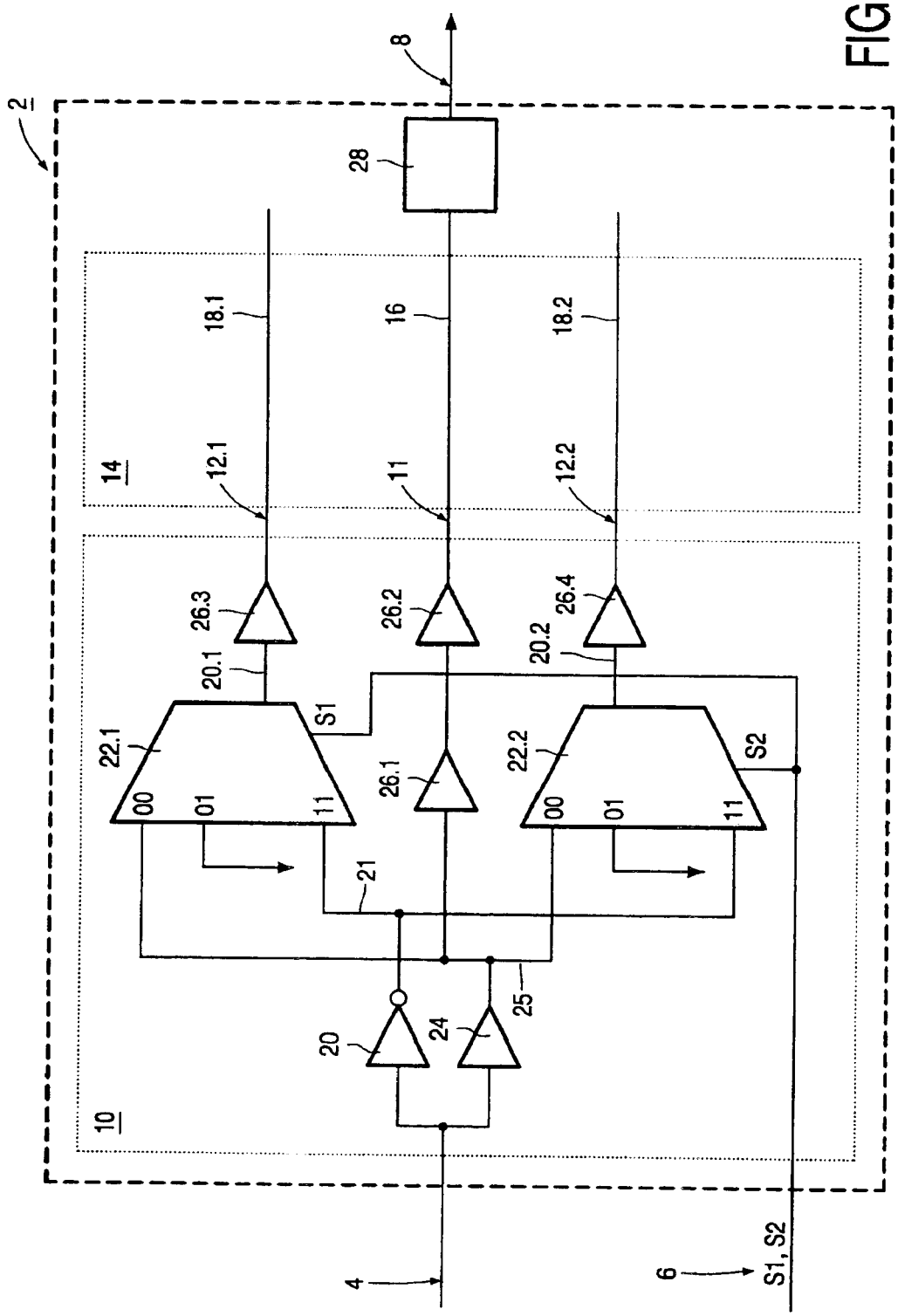

FIG. 1 diagrammatically shows a controllable delay circuit 2 according to the invention for delaying an electric input signal 4, which delay circuit 2 is designed for receiving the input signal 4 and a control signal 6. During operation, the delay circuit 2 can delay the input signal 4 by a delay so as to generate an output signal 8. The delay is controllable by means of the control signal 6 in this case. The controllable delay circuit 2 in this example is of a digital construction. This implies inter alia that the input signal 4, the control signal 6, and the output signal 8 are digital signals.

The delay circuit 2 comprises a first module 10 for generating a base signal 11 and support signals 12.1 and 12.2 on the basis of the input signal 4 and the control signal 6. The phases of the support signals 12.1 and 12.2 are controllable here by means of the control signal 6. The delay circuit 2 further comprises a second module 14 connected to the first module 10. This second module 14 comprises a signal conductor 16 and two support conductors 18.1 and 18.2. The signal conductor 16 and the support conductors 18.1 and 18.2 extend substantially parallel and in one another's vicinity.

The operation of the controllable delay circuit 2 will now be discussed in detail below.

The first module 10 comprises an inverter 20 for inverting the input signal 4. An inverted input signal 21 is thus obtained. The first module 10 further comprises a delay element 24 with a fixed delay which is substantially equal to the delay of the inverter 20. The delay element 24 generates an input signal 25 delayed by said fixed delay. The signal 25 is passed on through the delay element 24 to multiplexers 22.1 and 22.2. The inverted input signal 21 is also supplied to the multiplexers 22.1 and 22.2 such that the signal 25 is delivered substantially simultaneously with the inverted input signal 21 to the multiplexers 22.1 and 22.2. It is noted here that, if the delays of the inverter 20 and the multiplexers 22.1 and 22.2 are comparatively small, it is alternatively possible to supply the input signal 4 directly as a base signal 11 to the signal conductor 16.

As is shown in FIG. 1, each of the multiplexers 22.1, 22.2 has three inputs 00, 01, and 11. The signal 25 is supplied to the 00 inputs and the inverted input signal 21 to the 11 inputs. The 01 inputs of said multiplexers 22.1, 22.2 are connected to ground so that the zero signal is supplied to these inputs. The multiplexers 22.1 and 22.2 can be controlled by means of the control signal 6. The control signal 6 here comprises the sub-signals S1 and S2. The sub-signal S1 controls the multiplexer 22.1, and the sub-signal S2 controls the multiplexer 22.2. Thus one of the signals at one of the inputs of the multiplexer 22.1 can be selected with S1. The input signal thus selected is subsequently conducted via the output of the multiplexer 22.1 and the fixed delay unit 26.3 to the support conductor 18.1 of the second module 14. In an analogous manner, the sub-signal S2 selects a signal at an input of the multiplexer 22.2, whereupon the selected signal is conducted via the fixed delay unit 26.4 to the support conductor 18.2 of the second module 14.

The input signal 4 is sent to the signal conductor 16 of the second module 14 via the fixed delay units 24, 26.1 and 26.2 by the first module 10. The base signal 11 is thus formed, and is subsequently offered to the signal conductor 16. The fixed delay units 24, 26.1, 26.2, 26.3 and 26.4 are dimensioned such that the base signal 11 and the support signals 12.1 and 12.2 are supplied substantially simultaneously to the ends of the respective conductors of the second module 14 by the first module 10.

The signal conductor 16 is preferably connected to a receiver 28 for receiving the base signal 11 at the second end of the signal conductor 16. In the example of the controllable delay circuit of FIG. 1, the receiver 28 amplifies the signal 27 for the generation of the output signal 8.

During the transport of the base signal 11 and the support signals 12.1, 12.2 through the respective conductors 16 and 18.1, 18.2 there will be a lateral capacitive coupling between the signal conductor 16 and the support conductors 18.1, 18.2. According to the invention, this capacitive coupling is utilized for controlling the transport speed of the base signal 11 through the signal conductor 16. The lateral capacitive coupling between the signal conductor 16 and the at least one support conductor 18.1, 18.2 is varied here in that inter alia the phase difference between the signal and the support signals is varied, whereby the delay of the controllable delay circuit 2 can be controlled. The delay is a maximum in the case of a maximum lateral capacitive coupling, and the delay is a minimum in the case of a minimum lateral capacitive coupling. The support conductors 18.1 and 18.2 are preferably positioned at different distances from the signal conductor 16. This makes the capacitive coupling of each individual support conductor with respect to the signal conductor intrinsically different, so that a good distribution of the (discrete) delay values in said control range of the digital controllable delay circuit 2 can be achieved.

The control signal 6 controls the multiplexers 22.1 and 22.2 for selecting the support signals 12.1 and 12.2, respectively, from the set of input signals of these multiplexers. This set of input signals comprises the delayed input signal 25, the inverted input signal 21, and the zero signal. There is a choice of three input signals for each support signal 12.1, 12.2, so that nine different combinations are possible. Such a combination will be denoted a transport mode of the controllable delay circuit 2 hereinafter. If the support conductors 18.1, 18.2 are at different distances away from the signal conductor 16, each transport mode will have a characteristic delay. A possible transport mode is selected by means of the control signal {S1 =00, S2 =11}, wherein the multiplexer 22.1 selects the signal 25 and the multiplexer 22.2 selects the inverted input signal 21. As a result, the support signal 12.1 has a zero phase difference with respect to the base signal 11, and the support signal 12.2 will have a phase difference of 180° with respect to the base signal 11.

FIG. 2 is a table showing the interrelationships between the control signal 6, consisting of the sub-signals S1 and S2, and a number of transport modes of the delay circuit 2. Nine different transport modes A to I with the associated control signals S1, S2 are given for the controllable delay circuit 2 in the table of FIG. 2.

Figure 3:
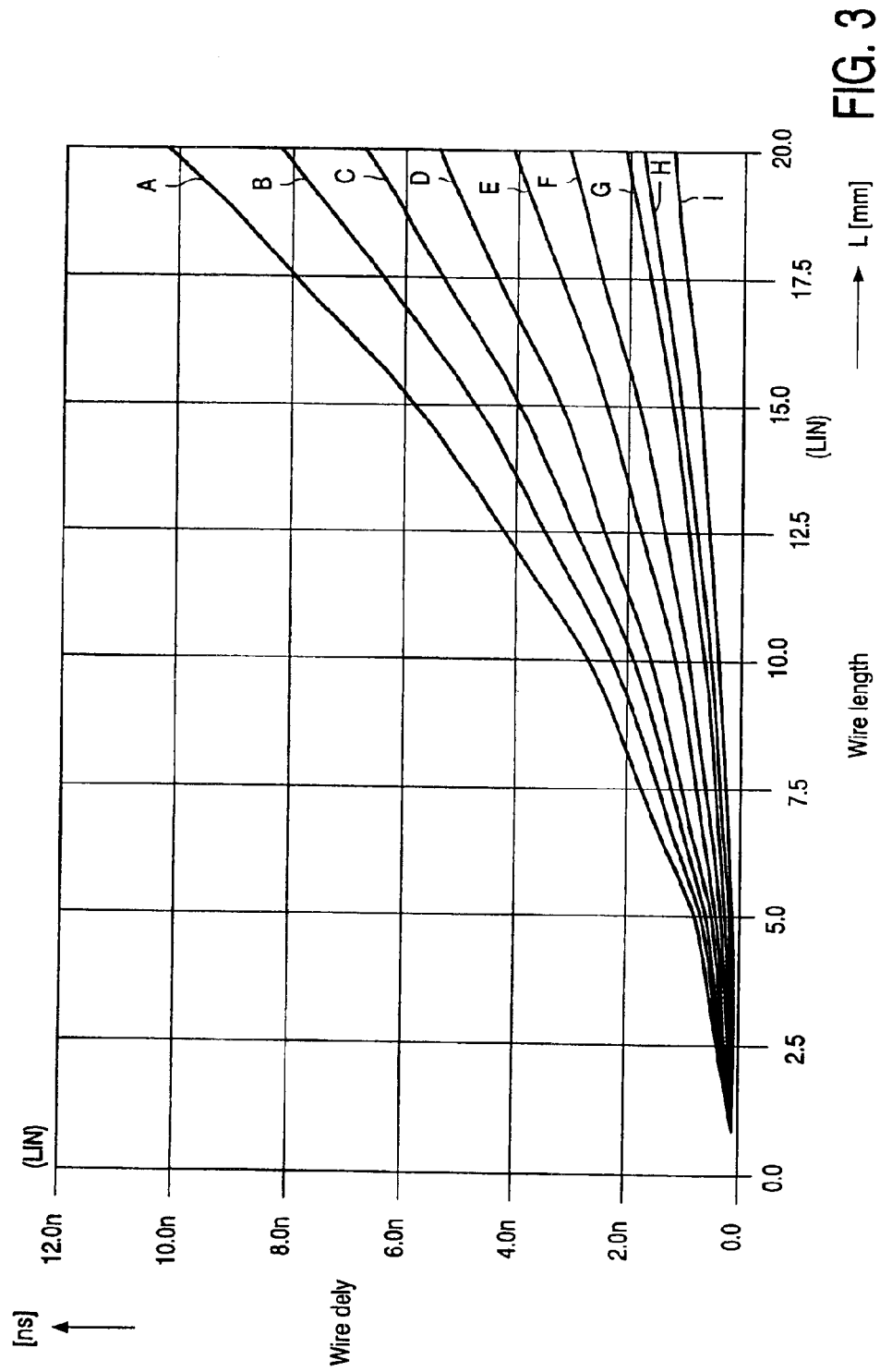
FIG. 3 is a diagram of the delay as a function of the length of the signal conductor for a number of transport modes in a first implementation of a controllable delay circuit as shown in FIG. 1.

FIG. 3 is a diagram representing the delay of the second module 14 of the controllable delay circuit 2 in the various transport modes A to I as a function of the length of the signal conductor 16. The distance between the support conductor 18.2 and the signal conductor 16 is twice the distance between the support conductor 18.1 and the signal conductor 16 here. The result of this is that each transport mode is accompanied by a characteristic delay. The delay values shown in FIG. 3 are the delays suffered by the signal in the second module 14. To obtain the total delay, these values are to be added to the fixed delay imposed on the signal in the first module 10. The delay in nanoseconds is plotted on the vertical axis, and the length of the signal conductor in millimeters on the horizontal axis. It is apparent from the diagram inter alia that the control range of the controllable delay circuit 2 is a function of the length of the signal conductor. The length of the signal conductor is equal to the length of the support conductors in the controllable delay circuit 2 in this example. The transport mode A corresponds to the greatest delay. The base signal 11 in the signal conductor 16 is in counterphase with the support signals 12.1 and 12.2 in the respective support conductors 18.1 and 18.2 in this mode. The transport mode I is the transport mode with the smallest delay. In this transport mode, the support signals 12.1 and 12.2 are in phase with the base signal 11. The unequal distances of the support conductors 18.1 and 18.2 from the signal conductor 16 achieve a greater resolution of delay values over the delay range in the example of FIG. 3.

Figure 4:
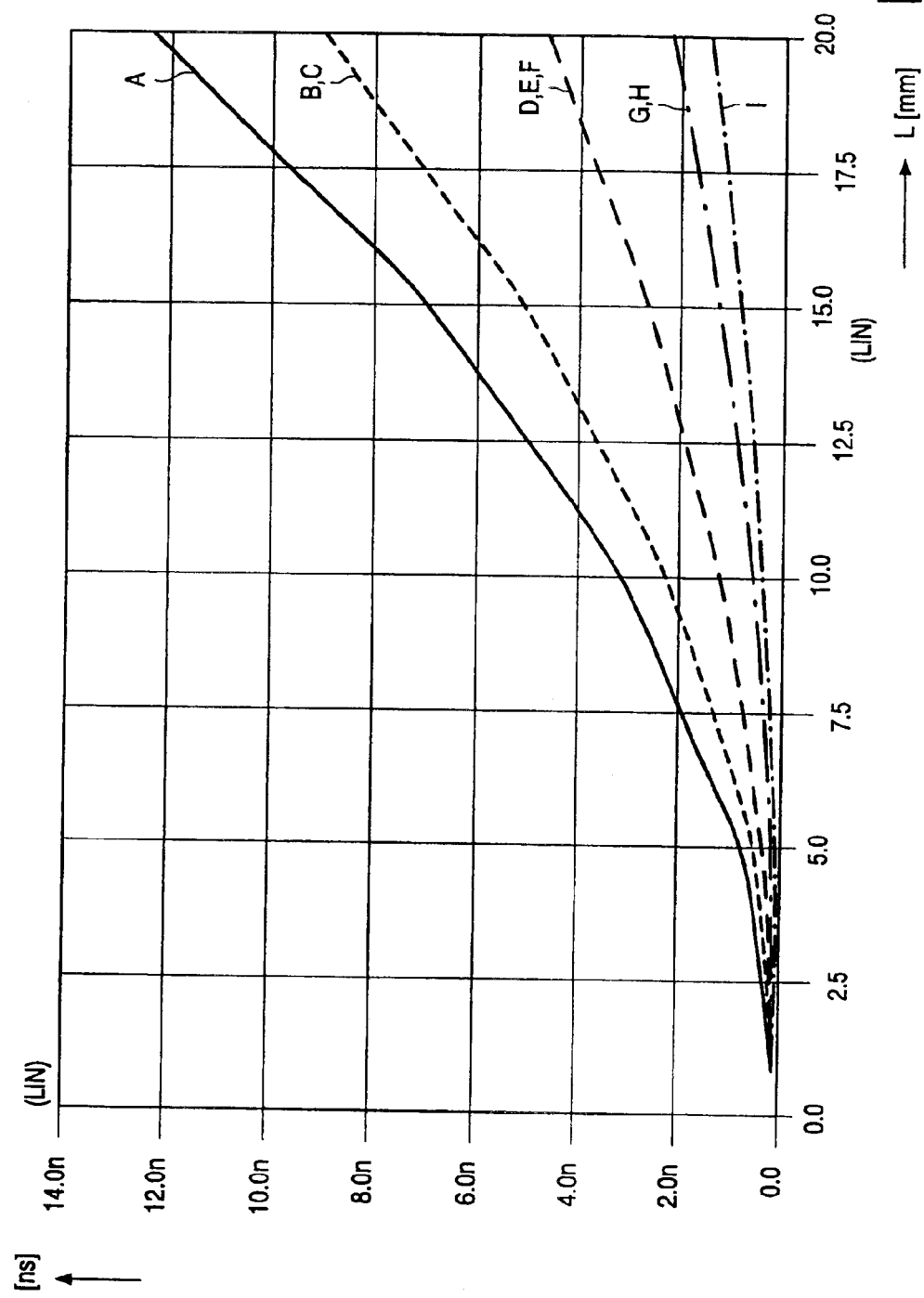
FIG. 4 is a diagram of the delay as a function of the length of the signal conductor for a number of transport modes in a second implementation of a controllable delay circuit as shown in FIG. 1.

FIG. 4 is also a diagram of the delay of the second module 14 of the controllable delay circuit 2 in the various transport modes A to I as a function of the length of the signal conductor 16. Here, however, the support conductors 18.1 and 18.2 are at the same distance from the signal conductor 16. Among the results of this is that a number of delay values of various transport modes coincide, as is shown in FIG. 4. This means that there are five different delay values for a given length of the signal conductor 16. These delay values are achieved in the following five situations, respectively: 1) mode A; 2) mode B or C; 3) mode D, E, or F; 4) mode G or H; and 5) mode I. The distance between the support conductor 18.2 and the signal conductor 16 is smaller in this example than the corresponding distance in the example of FIG. 3. The support conductor 18.1 is at the same distance from the signal conductor 16 in both examples. The result of this is that the control range realized in the present example is wider than the control range in FIG. 3 (a stronger lateral capacitive coupling between the support conductor 18.2 and the signal conductor 16). The resolution of the achievable delays is smaller in this example because of the coincidence of the delays of a number of transport modes.

It is noted here that the controllable delay circuit 2 may be adapted in a simple manner such that the control signal 6 also controls the amplitude of the support signals 12.1 and 12.2. This provides a fine tuning of said capacitive coupling with a greater number of transport modes with accompanying delay values in the control range mentioned above.

Figure 5:
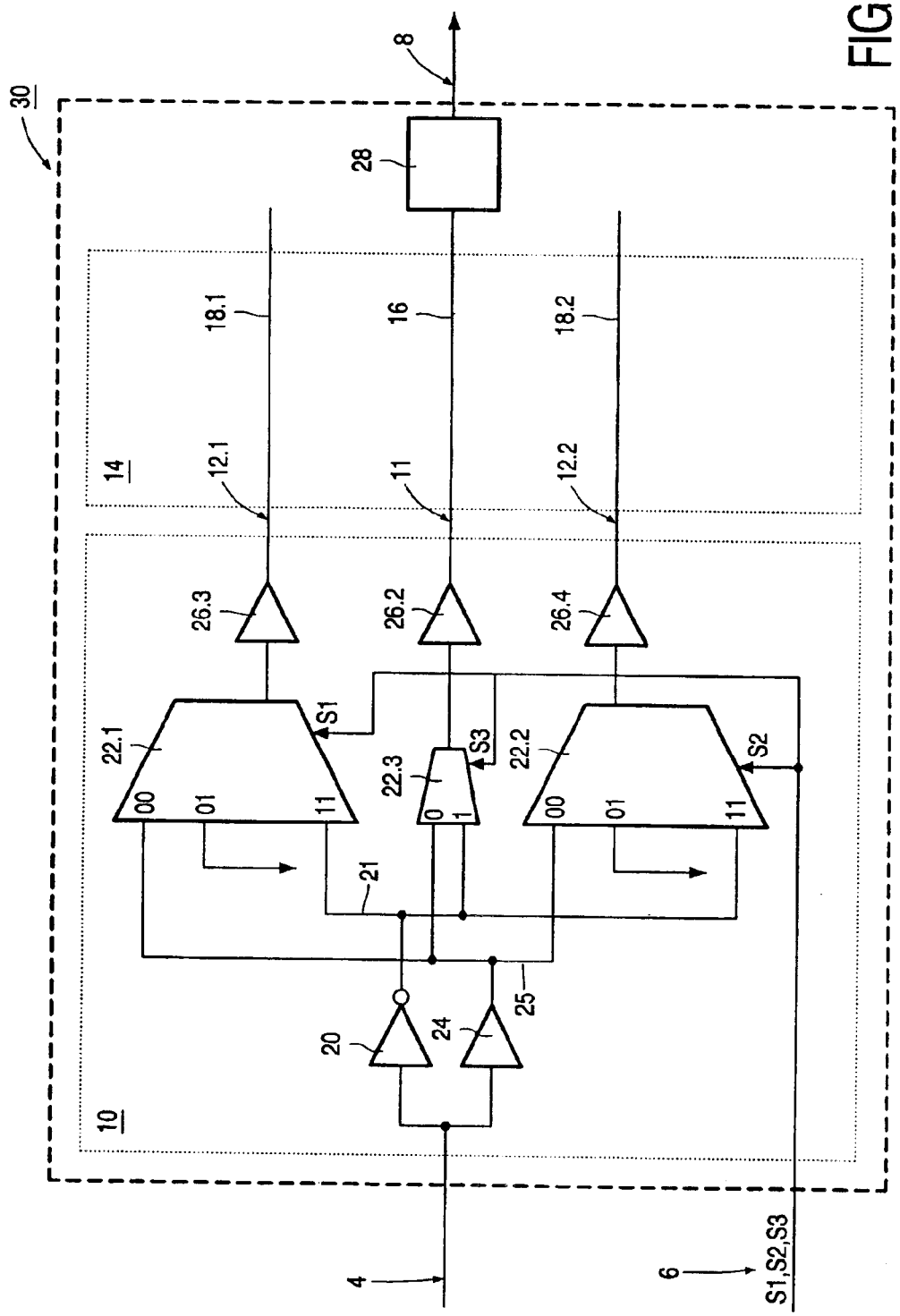
FIG. 5 diagrammatically shows a second embodiment of a controllable delay circuit according to the invention.

FIG. 5 diagrammatically shows a second embodiment 30 of a controllable delay circuit according to the invention. Comparable components have been given comparable reference numerals in FIG. 5 and FIG. 1. The controllable delay circuit 30, which is largely comparable to the delay circuit 2, is provided with a multiplexer 22.3 (the fixed delay unit 26.1 of FIG. 1 is replaced by the multiplexer 22.3). The multiplexer 22.3 is connected to the inverter 20 and to the fixed delay unit 24. The control signal 6 of the controllable delay circuit 30 comprises three sub-signals S1, S2 and S3. The sub-signals S1 and S2 are supplied to the multiplexers 22.1 and 22.2, respectively (similar to what takes place in the delay circuit 2). The third sub-signal S3 is supplied to the multiplexer 22.3. If S3=0, the multiplexer 22.3 will select the signal 25, and if S3=1, the inverted input signal 21 will be selected. The selected signal is subsequently supplied as a base signal 11 to the signal conductor 16 of the second module 14 via the delay unit 26.2. It is possible with the multiplexer 22.3 to impose an additional phase shift not only on the support signals, but also on the input signal 4 with a 50% duty cycle, for example the system clock. The number of different transport modes can be increased thereby.

Various modifications are conceivable in the embodiments of the controllable delay circuit 2 mentioned above. A number of possible modifications will be briefly discussed below.

In a first modification, a signal conductor is tapped by means of a number of tap conductors which are connected in various locations to the signal conductor 16. Each tap conductor may then be connected to, for example, a multiplexer. A desired tapped signal with a desired delay may subsequently be selected by the multiplexer.

A second modification consists in that two or more controllable delay circuits according to the invention are connected in series.

In a third modification, a switch (for example a pass-gate switch) is provided in a support conductor. The length of the support conductor, and thus the capacitive coupling to the signal conductor, can be varied through opening and closing of the switch. A further control of the controllable delays of the controllable delay circuit according to the invention is thus provided thereby.

The invention was described with reference to a few embodiments. It will be evident to those skilled in the art, however, that many embodiments are possible which also fall within the scope of the invention. All these embodiments are deemed to be part of the invention. It is noted first of all that said support conductors and signal conductors may be of various shapes and designs. The conductors may be wires, for example with round cross-sections or square cross-sections. It is also possible for the conductors to be hollow (coax cables). It is furthermore possible for the conductors to be strip-shaped. The delay circuit according to the invention may be provided with more than two support conductors which are located at different distances from the signal conductor. If four support conductors are chosen, for example, at different distances, there will be a maximum of 81 different delay values which can be selected by the controllable delay circuit. A possibility is that some of the (support) conductors are provided with fixed delay elements. It is further noted that it is by no means necessary for a support conductor to have the same length as the signal conductor. Thus it is possible, for example, that one or several support conductors extend over only part of the length of the signal conductor (parallel to the signal conductor). It is alternatively possible for the signal conductor to have a specific shape for achieving a favorable capacitive coupling. It is conceivable, for example, that the surface area of a perpendicular cross-section of the signal conductor decreases, seen in the transport direction of the signal in the signal conductor. An optimized capacitive coupling between the conductors may be achieved in that the conductors are given adapted shapes. It is finally possible to construct the delay circuit according to the invention in analog circuitry.

What is claimed is:

1. A controllable delay circuit (2) for delaying an electric input signal (4), which delay circuit (2) is designed for receiving the input signal (4) and at least one independent external control signal (6), wherein during operation the delay circuit (2) delays the input signal (4) by a delay for generating an output signal (8), which delay is a function of the at least one control signal (6), characterized in that the delay circuit (2) comprises a first module (10) for generating a base signal (11) and at least one support signal (12) on the basis of the input signal (4) and the at least one control signal (6), wherein during operation the phase and/or the amplitude of the at least one support signal (12) is controllable with respect to the phase and/or the amplitude of the base signal (11) by means of the at least one control signal (6), and wherein the delay circuit (2) furthermore comprises a second module (14) which is connected to the first module (10) and which comprises a signal conductor (16) and at least one support conductor (18), which signal conductor (16) and which at least one support conductor (18) extend mutually substantially parallel over at least a portion of the conductors in one another's vicinity, and wherein during operation the first module (10) supplies the base signal (11) to a first end of the signal conductor (16) for generating the output signal (8) at a second end of the signal conductor (16), and wherein during operation the first module (10) supplies at least the at least one support signal (12) to the at least one support conductor (18).

2. A circuit as claimed in claim 1, wherein the base signal (11) is formed by an input signal (4) which was delayed independently of the control signal (6).

3. A circuit as claimed in claim 1, wherein the base signal (11) consists of the input signal (4).

4. A circuit as claimed in claim 1, wherein the second module (14) comprises at least two support conductors (18.1, 18.2), of which at least two support conductors are at different distances from the signal conductor (16), while during operation the first module (10) generates at least two support signals (12.1, 12.2).

5. A circuit as claimed in claim 4, wherein the support conductors (18.1, 18.2) and the signal conductor (16) lie in one plane, which plane is divided by the signal conductor (16) into a first plane portion and a second plane portion, such that the support conductors (18.1, 18.2) are present in the first plane portion.

6. A circuit as claimed in claim 1, wherein the second module (14) comprises at least two support conductors (18.1, 18.2), of which at least two support conductors are at least substantially at the same distance from the at least one signal conductor (16).

7. A circuit as claimed in claim 1, wherein the delay circuit (2) comprises a receiver (28) which is connected to the second end of said signal conductor (16) for receiving the output signal (8).

8. A circuit as claimed in claim 1, wherein the second module (14) is in addition provided with a substrate layer or a metal plate, which layer or plate extends substantially along the signal conductor (16).

9. A circuit as claimed in claim 1, wherein the first module (10) comprises at least a first supply conductor, a second supply conductor, an inverter (20), and a multiplexer 22, while an output of the inverter (20) is connected to a first input of the multiplexer (22), and the first supply conductor is connected both to an input of the inverter (20) and to a second input of the multiplexer (22), wherein during operation a signal with a constant voltage is supplied to a third input of the multiplexer (22), and wherein the second supply conductor is connected to the multiplexer (22) for supplying a control signal of the at least one control signal (6) to the multiplexer, and wherein during operation the input signal (4) is supplied to the second input of the multiplexer (22) via the first supply conductor, and wherein the multiplexer (22) selects one of the signals offered at the inputs of the multiplexer on the basis of the control signal so as to generate a support signal of the at least one support signal (12) and to supply the support signal to a support conductor of the at least one support conductor (18).

* * * * *